United States Patent
Kimura

(10) Patent No.: US 6,790,291 B2
(45) Date of Patent: Sep. 14, 2004

(54) METHOD OF AND APPARATUS FOR PROCESSING SUBSTRATE

(75) Inventor: Masahiro Kimura, Kyoto (JP)

(73) Assignee: Dainippon Screen Mfg. Co. Ltd. (JP)

( * ) Notice: Subject to any disclaimer, the term of this patent is extended or adjusted under 35 U.S.C. 154(b) by 560 days.

(21) Appl. No.: 09/962,961

(22) Filed: Sep. 25, 2001

(65) Prior Publication Data

US 2002/0036005 A1 Mar. 28, 2002

(30) Foreign Application Priority Data

Sep. 28, 2000 (JP) ........................................ 2000-296343

(51) Int. Cl.$^7$ ............................................... B08B 7/04
(52) U.S. Cl. ............................. 134/30; 134/26; 134/31; 134/34; 134/37; 134/21; 134/902; 134/200; 134/95.2; 134/102.3; 34/92; 34/402; 34/413
(58) Field of Search ............................. 134/18, 21, 26, 134/30, 31, 34, 37, 95, 102.3, 200, 902; 34/92, 406, 407, 413, 414, 415, 444, 445, 565, 402

(56) References Cited

U.S. PATENT DOCUMENTS

| | | | | |
|---|---|---|---|---|
| 5,222,307 A | * | 6/1993 | Oba et al. ...................... | 34/417 |
| 5,315,766 A | * | 5/1994 | Roberson et al. .............. | 34/409 |
| 5,951,779 A | * | 9/1999 | Koyanagi et al. ............... | 134/2 |
| 6,164,297 A | * | 12/2000 | Kamikawa .................... | 134/61 |
| 6,350,322 B1 | * | 2/2002 | Yates ............................ | 134/3 |
| 6,401,361 B1 | * | 6/2002 | Chen et al. .................... | 34/467 |

* cited by examiner

Primary Examiner—Alexander Markoff
(74) Attorney, Agent, or Firm—Ostrolenk, Faber, Gerb & Soffen, LLP

(57) ABSTRACT

In a substrate processing apparatus for use in performing a reduced-pressure pull up drying method, a liquid drainage pipe (46) for draining a drainage liquid containing an organic solvent from a processing chamber (26) including therein a processing bath (10) for rinsing a substrate (W) with water is provided with a buffer tank (50) inserted therein for separation between the drainage liquid and an organic solvent vapor. A vapor discharge pipe (62) is connected in communication with an interior space of the buffer tank, and is provided with pressure regulating valves (64a, 64b) inserted therein for regulating pressure in the processing chamber at a fixed pressure higher than atmospheric pressure.

12 Claims, 4 Drawing Sheets

METHOD OF AND APPARATUS FOR PROCESSING SUBSTRATE

BACKGROUND OF THE INVENTION

1. Field of the Invention

The present invention relates to a substrate processing method which comprises immersing a substrate such as a semiconductor wafer, a glass substrate for a liquid crystal display device and a substrate for an electronic component in pure water stored in a processing bath to rinse the substrate with the pure water, exposing the substrate by pulling up out of the pure water or by draining the pure water from the processing bath, supplying a water-soluble organic solvent vapor such as an isopropyl alcohol (IPA) vapor to the substrate in the exposing step, and then drying the substrate under reduced pressure. The invention also relates to a substrate processing apparatus for use in executing the substrate processing method.

2. Description of the Background Art

Examples of a method of drying a substrate, e.g. a silicon wafer, after the wafer is rinsed with pure water in the process of manufacturing a semiconductor device include a spin drying method, an IPA vapor drying method, and a reduced-pressure pull up drying method using a water-soluble organic solvent vapor such as an IPA vapor. In recent years, the reduced-pressure pull up drying method has become mainstream. The reduced-pressure pull up drying method comprises: immersing a wafer in pure water stored in a processing bath to rinse the wafer with the pure water; pulling up the wafer out of the pure water in the processing bath (or draining the pure water from the processing bath, with the rinsed wafer held stationary in the processing bath) after the immersing step to expose the wafer from the pure water; supplying an IPA vapor to the wafer using an inert gas, e.g. nitrogen gas, as a carrier gas in the exposing step to condense the IPA vapor at a vapor-liquid interface on the surface of the wafer, thereby causing IPA to displace pure water deposited on the wafer surface; evacuating an enclosed processing chamber in which the processing bath is provided to a reduced pressure to vaporize the IPA condensed on the wafer surface, thereby rapidly drying the wafer.

FIG. 4 is a schematic view showing a general construction of a substrate processing apparatus for use in executing the reduced-pressure pull up drying method. This apparatus comprises a processing bath 102 in an enclosable processing chamber 100. Pure water supply means not shown supplies pure water into the processing bath 102, and a wafer W is immersed in and rinsed with pure water 104 filling the processing bath 102. Blast nozzles 106 are provided in an inner top portion of the processing chamber 100. The blast nozzles 106 supply nitrogen gas for purging the interior of the processing chamber 100, and supply an IPA vapor to the wafer W using nitrogen gas as a carrier gas when pulling up and drying the wafer W.

A gas/liquid discharge outlet 108 is provided in a bottom portion of the processing chamber 100, and is connected in communication with a gas/liquid discharge pipe 110. The gas/liquid discharge pipe 110 is connected in communication with an exhaust pipe 112, a water drainage pipe 116, and a liquid drainage pipe 120. The exhaust pipe 112 is provided with an open/close control valve 114 inserted therein which is opened when placing the interior of the processing chamber 100 under reduced pressure. The water drainage pipe 116 is provided with an open/close control valve 118 inserted therein which is opened during the rinsing of the wafer W with water, and drains the pure water overflowing from the processing bath 102 down to an inner bottom portion of the processing chamber 100. The liquid drainage pipe 120 is provided with an open/close control valve 122 inserted therein which is opened during the supply of the IPA vapor to the wafer W, and drains drainage liquid containing IPA.

Although the above described reduced-pressure pull up drying method is capable of drying a wafer using a small amount of IPA, further reduction in the amount of IPA consumption has been required from the viewpoint of recent environmental issues. In the conventional substrate processing apparatus, however, the IPA vapor supplied from the blast nozzles 106 to the wafer W flows from the interior of the processing chamber 100 via the gas/liquid discharge pipe 110 into the liquid drainage pipe 120, and is drained through the liquid drainage pipe 120. This presents the problem of consumption of more IPA than necessary.

Further, since the liquid drainage pipe 120 has an outlet of the IPA vapor, the state of atmosphere in a wafer drying zone within the processing chamber 100 becomes unstable under the influence of the operating status of utilities in a factory to which the liquid drainage pipe 120 is connected. Besides, there arises a difference in state of atmosphere between apparatuses, depending upon installation circumstances of the apparatuses. The conventional substrate processing apparatus has the problem of the lack of stability of wafer drying performance, coupled with the increased complexity and size reduction of a structure of a semiconductor device.

SUMMARY OF THE INVENTION

The present invention is intended for a substrate processing apparatus for supplying of an organic solvent vapor to a substrate exposed from pure water to dry the substrate.

According to the present invention, the apparatus for performing predetermined processing on a substrate, comprises: a substrate exposing section for exposing a substrate from pure water stored in a processing bath disposed in a processing chamber; a vapor supply section for supplying a water-soluble organic solvent vapor to the substrate; an evacuating section for evacuating an interior of the processing chamber; and a pressure regulating section for regulating pressure in the processing chamber at a fixed pressure when the organic solvent vapor is supplied to the substrate, the fixed pressure being higher than atmospheric pressure and remaining within a limit for maintenance of supply of the organic solvent vapor.

In the apparatus according to the present invention, the pressure regulating section regulates the pressure in the processing chamber at the pressure higher than atmospheric pressure when the organic solvent vapor is supplied to the substrate exposed from the pure water in the processing bath within the processing chamber. This reduces the amount of organic solvent vapor flowing out of the processing chamber. Additionally, the regulation of the pressure in the processing chamber at the fixed pressure stabilizes the state of atmosphere in a substrate drying zone in the processing chamber.

Preferably, according to a first aspect of the present invention, the apparatus further comprises a liquid drainage pipe for draining a drainage liquid containing an organic solvent flowing out of the processing chamber, wherein the pressure regulating section comprising: a buffer tank inserted at some midpoint in the liquid drainage pipe and having an enclosed structure, the buffer tank including an inlet and an outlet, the inlet being disposed above the outlet, the buffer tank having an interior vertically divided into a drainage liquid incoming compartment and a drainage liquid outgoing compartment, the drainage liquid incoming compartment and the drainage liquid outgoing compartment being in communication with each other at a position lower than the outlet; a vapor discharge pipe connected in communication with the drainage liquid incoming compartment of the buffer tank; and a pressure regulating valve inserted in the vapor discharge pipe.

In the apparatus according to the first aspect of the present invention, a flow path portion of the liquid drainage pipe which is upstream of the buffer tank and the drainage liquid incoming compartment of the buffer tank provide communication between the interior space of the processing chamber and the vapor discharge pipe. A partition inside the buffer tank and the drainage liquid stored in an inner bottom portion of the buffer tank up to the level of the outlet interrupt communication between the interior space of the processing chamber and a flow path portion of the liquid drainage pipe which is downstream of the buffer tank. Thus, the organic solvent vapor flowing out of the processing chamber does not flow to the flow path portion of the liquid drainage pipe which is downstream of the buffer tank, but flows out through the vapor discharge pipe. Controlling the pressure regulating valve inserted in the vapor discharge pipe to regulate the pressure in the processing chamber at a pressure higher than atmospheric pressure reduces the amount of organic solvent vapor flowing out of the processing chamber through the vapor discharge pipe. Additionally, controlling the pressure regulating valve to regulate the pressure in the processing chamber at the fixed pressure stabilizes the state of atmosphere in the substrate drying zone in the processing chamber. The drainage liquid containing the organic solvent stays temporarily in the inner bottom portion of the buffer tank, flows from the inner bottom portion of the buffer tank through the outlet into the liquid drainage pipe, and is drained.

Preferably, according to a second aspect of the present invention, the apparatus further comprises: a liquid drainage pipe for draining a drainage liquid containing an organic solvent flowing out of the processing chamber, wherein the pressure regulating section comprising: a vapor discharge pipe connected to the liquid drainage pipe; a trap inserted at some midpoint in the vapor discharge pipe; and a pressure regulating valve inserted in the vapor discharge pipe.

In the apparatus according to the second aspect of the present invention, the organic solvent vapor flowing out of the processing chamber flows out through the vapor discharge pipe connected to the liquid drainage pipe. Thus, controlling the pressure regulating valve inserted in the vapor discharge pipe to regulate the pressure in the processing chamber at a pressure higher than atmospheric pressure reduces the amount of organic solvent vapor flowing out of the processing chamber through the vapor discharge pipe. Additionally, controlling the pressure regulating valve to regulate the pressure in the processing chamber at the fixed pressure stabilizes the state of atmosphere in the substrate drying zone in the processing chamber. The drainage liquid containing the organic solvent collects in the trap, and is drained out of the trap as required.

The present invention is also intended for a method of performing predetermined processing on a substrate.

It is therefore an object of the present invention to provide a substrate processing method capable of reducing the amount of consumption of organic solvent such as IPA and improving the stability of substrate drying performance when performing a reduced-pressure pull up drying method, and to provide a substrate processing apparatus capable of preferably performing the substrate processing method.

These and other objects, features, aspects and advantages of the present invention will become more apparent from the following detailed description of the present invention when taken in conjunction with the accompanying drawings.

DESCRIPTION OF THE PREFERRED EMBODIMENTS

A preferred embodiment according to the present invention will now be described with reference to FIGS. 1, 2A through 2D, and 3.

Figure 1:
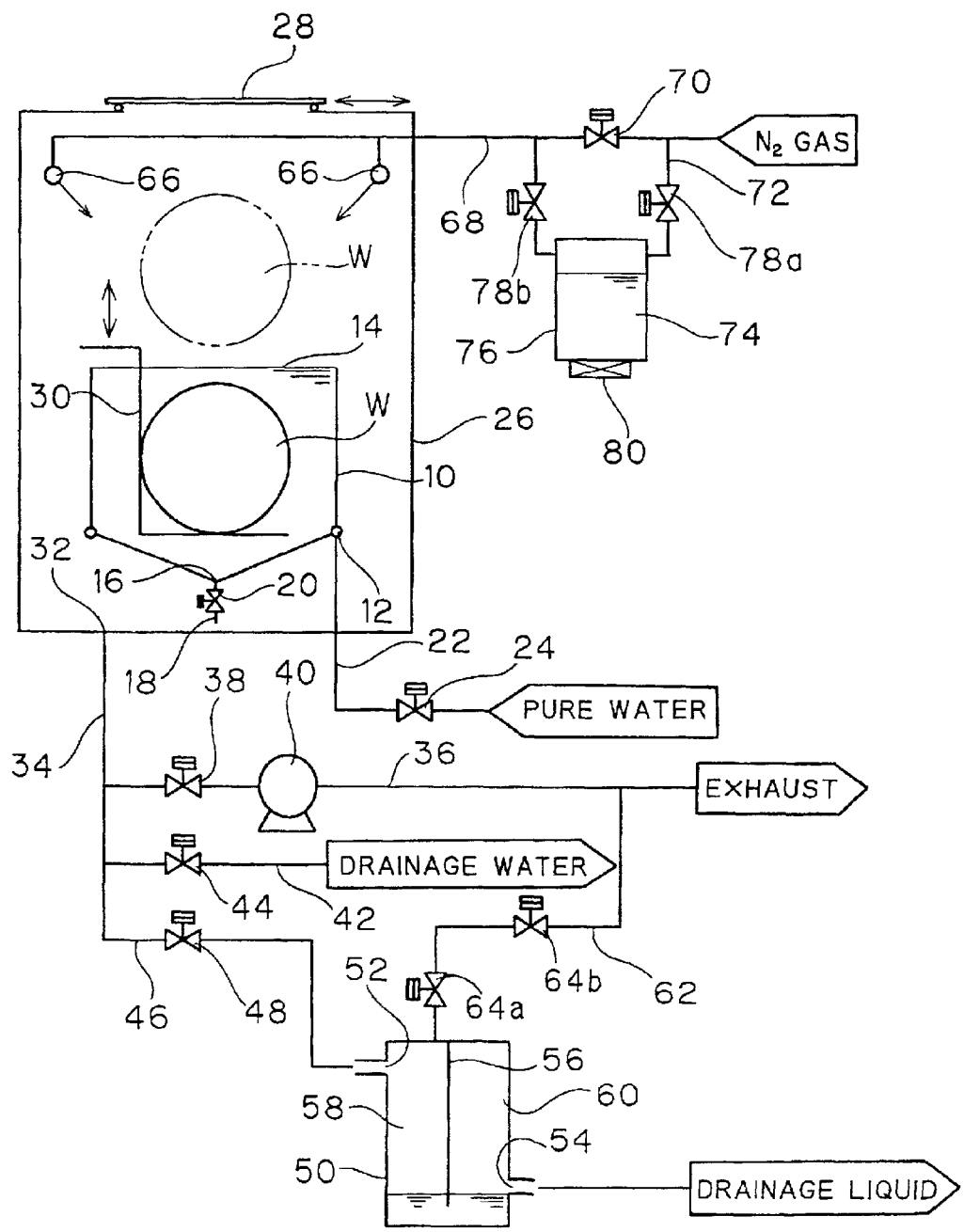
FIG. 1 is a schematic view showing an example of the construction of a substrate processing apparatus for use in performing a substrate processing method according to the present invention.

FIG. 1 is a schematic view showing an example of the construction of a substrate processing apparatus for use in performing a substrate processing method according to the present invention. The substrate processing apparatus comprises a processing bath 10 for receiving a wafer W loaded therein. The processing bath 10 has a pure water supply port 12 in a lower portion thereof, and an overflow section 14 from which pure water overflows in an upper portion thereof. A water drainage port 16 is formed in a bottom portion of the processing bath 10, and is connected in communication with a water drainage pipe 18 with a water drainage valve 20 inserted therein. The pure water supply port 12 in the lower portion of the processing bath 10 is connected in communication with a pure water supply pipe 22 connected to a source of pure water. The pure water supply pipe 22 is provided with an open/close control valve 24 inserted therein.

The processing bath 10 is disposed in a processing chamber 26 having a cover 28 which is opened to allow the wafer W to be loaded thereinto and unloaded therefrom, and is closed to enclose the processing chamber 26. In the processing chamber 26 is disposed a lifter 30 for receiving the wafer W loaded into the processing chamber 26 to insert the wafer W into the processing bath 10 and for lifting the processed wafer W out of the processing bath 10. A gas/liquid discharge outlet 32 is formed in a bottom portion of the processing chamber 26, and is connected in communication with a gas/liquid discharge pipe 34. The gas/liquid discharge pipe 34 is connected in communication with an exhaust pipe 36, a water drainage pipe 42, and a liquid drainage pipe 46. The exhaust pipe 36 is provided with an open/close control valve 38 inserted therein which is opened when placing the interior of the processing chamber 26 under reduced pressure, and is connected to a vacuum pump 40. The water drainage pipe 42 is provided with an open/ close control valve 44 inserted therein which is opened during the rinsing of the wafer W with water, and drains the pure water overflowing from the overflow section 14 of the processing bath 10 down to an inner bottom portion of the processing chamber 26. The liquid drainage pipe 46 is provided with an open/close control valve 48 inserted therein which is opened during the supply of a water-soluble organic solvent vapor, e.g. an IPA vapor, to the wafer W, and drains drainage liquid containing IPA.

A buffer tank 50 is provided which is inserted at some midpoint in the liquid drainage pipe 46. The buffer tank 50 has an enclosed structure with an inlet 52 disposed above an outlet 54. The interior of the buffer tank 50 is divided by a vertical partition wall 56 into a drainage liquid incoming compartment 58 and a drainage liquid outgoing compartment 60. The partition wall 56 extend from the ceiling surface of the buffer tank 50 to near the inner bottom surface thereof, and the drainage liquid incoming compartment 58 and the drainage liquid outgoing compartment 60 communicate with each other in a position lower than the outlet 54. A vapor discharge pipe 62 is connected to an upper portion of the buffer tank 50 so as to communicate with an interior space of the drainage liquid incoming compartment 58. The vapor discharge pipe 62 is provided with two pressure regulating valves 64a and 64b inserted therein.

Blast nozzles 66 are provided in the processing chamber 26, and are connected in communication with a gas supply pipe 68 connected to a source of an inert gas, e.g. nitrogen gas. The gas supply pipe 68 is provided with an open/close control valve 70 inserted therein, and a bypass pipe 72 which branches off from the gas supply pipe 68 upstream of the open/close control valve 70 and joins the gas supply pipe 68 downstream of the open/close control valve 70. An IPA vapor generator bath 76 storing IPA 74 and enclosed is provided at some midpoint in the bypass pipe 72. A nitrogen gas inlet and an IPA vapor outlet of the bypass pipe 72 communicate with an enclosed space above the liquid level in the IPA vapor generator bath 76. Open/close control valves 78a and 78b are inserted in the bypass pipe 72. A heater 80 for heating the IPA 74 stored in the IPA vapor generator bath 76 is mounted to the IPA vapor generator bath 76. The IPA vapor generator bath 76 is adapted to generate an IPA vapor by heating the IPA 74 by the heater 80 and to supply the generated IPA vapor from the bypass pipe 72 via the gas supply pipe 68 to the blast nozzles 66 in the processing chamber 26, using the nitrogen gas as a carrier gas.

An example of a substrate drying operation performed using the substrate processing apparatus constructed as stated above will be described with reference to schematic views shown in FIGS. 2A through 2D.

Figure 2A:
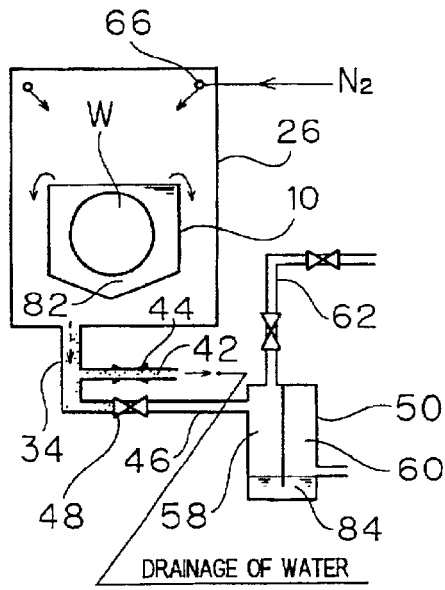
FIGS. 2A through 2D are schematic views for illustrating an example of a substrate drying operation performed using the substrate processing apparatus shown in FIG. 1.

As illustrated in FIG. 2A, the wafer W is immersed in pure water 82 stored in the processing bath 10 and is rinsed with the pure water 82. In this process step, the open/close control valve 44 inserted in the water drainage pipe 42 is opened, and the open/close control valve 48 inserted in the liquid drainage pipe 46 is closed. Thus, the pure water overflowing from the overflow section 14 of the processing bath 10 down to the inner bottom portion of the processing chamber 26 and exiting from the gas/liquid discharge outlet 32 flows from the gas/liquid discharge pipe 34 into the water drainage pipe 42, and is drained through the water drainage pipe 42. Further, in this process step, the open/close control valve 70 inserted in the gas supply pipe 68 is opened, and the open/close control valves 78a and 78b inserted in the bypass pipe 72 are closed. Thus, nitrogen gas is supplied from the blast nozzles 66 into the processing chamber 26. The nitrogen gas supplied into the processing chamber 26 flows from the gas/liquid discharge pipe 34 into the water drainage pipe 42, and is discharged through the water drainage pipe 42. At this time, the pressure in the processing chamber 26 is unregulated (normal pressure).

Figure 2B:
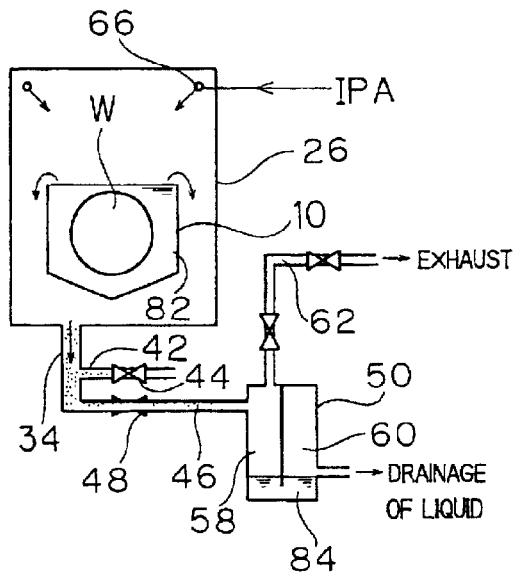

When the rinsing of the wafer W is close to completion (or immediately before a pull up drying process), as illustrated in FIG. 2B, the open/close control valve 70 inserted in the gas supply pipe 68 is closed, and the open/close control valves 78a and 78b inserted in the bypass pipe 72 are opened. Thus, the IPA vapor is supplied from the blast nozzles 66 into the processing chamber 26. At the same time, the open/close control valve 44 inserted in the water drainage pipe 42 is closed, and the open/close control valve 48 inserted in the liquid drainage pipe 46 is opened. Thus, drainage liquid containing IPA and the IPA vapor flow from the gas/liquid discharge pipe 34 into the liquid drainage pipe 46. Drainage liquid 84 containing IPA flows into the buffer tank 50, stays temporarily in the inner bottom portion thereof, and is drained from the outlet 54 of the buffer tank 50 through the liquid drainage pipe 46.

The IPA vapor, on the other hand, flows into the drainage liquid incoming compartment 58 of the buffer tank 50, and is exhausted from the drainage liquid incoming compartment 58 through the vapor discharge pipe 62. At this time, the two pressure regulating valves 64a and 64b regulate the pressure upstream thereof, i.e. the pressure in the processing chamber 26, at a fixed pressure higher than atmospheric pressure and remaining within a limit for maintenance of supply of the IPA vapor into the processing chamber 26. This reduces the amount of IPA vapor exhausted from the processing chamber 26 through the vapor discharge pipe 62. Additionally, the regulation of the pressure in the processing chamber 26 at the fixed pressure stabilizes the state of atmosphere in the processing chamber 26. This state is maintained while the IPA vapor is supplied into the processing chamber 26.

Figure 2C:
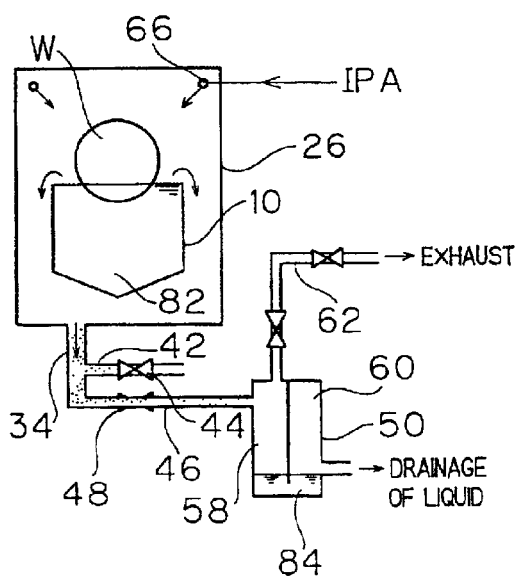
Figure 2D:
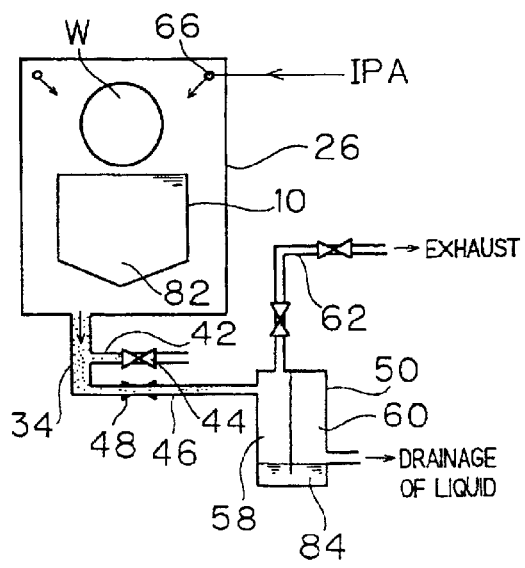

When the rinsing of the wafer W is completed, as illustrated in FIG. 2C, the lifter 30 slowly pulls up the wafer W out of the pure water 82 in the processing bath 10 while the supply of pure water into the processing bath 10 and the supply of IPA vapor into the processing chamber 26 continue. In this processing step, the IPA condenses at a gas-liquid interface on the surface of the wafer W, and the pure water is being displaced by IPA. Then, as illustrated in FIG. 2D, IPA vapor is continuously supplied into the processing chamber 26 for an appropriate length of time after the wafer W is completely pulled up out of the pure water 82 and stopped at a drying position. When the pure water has been displaced by IPA on the surface of the wafer W, the supply of the IPA vapor into the processing chamber 26 is stopped. The supply of the pure water into the processing bath 10 is stopped when the wafer W has been pulled up out of the pure water 82.

Thereafter, with the wafer W held in the processing chamber 26, the open/close control valve 70 inserted in the gas supply pipe 68 is opened, and the open/close control valves 78a and 78b inserted in the bypass pipe 72 are closed. Thus, nitrogen gas is supplied from the blast nozzles 66 into the processing chamber 26 to purge the interior of the processing chamber 26. At the same time, the open/close control valve 44 inserted in the water drainage pipe 42 is opened, and the open/close control valve 48 inserted in the liquid drainage pipe 46 is closed. At this time, the water drainage valve 20 is opened to discharge the pure water 82 in the processing bath 10 from the water drainage port 16 through the water drainage pipe 18. The pure water 82 is then drained from the inner bottom portion of the processing chamber 26 through the gas/liquid discharge outlet 32, the gas/liquid discharge pipe 34 and the water drainage pipe 42. Subsequently, the supply of nitrogen gas into the processing chamber 26 is stopped. The open/close control valve 44 inserted in the water drainage pipe 42 and the open/close control valve 48 inserted in the liquid drainage pipe 46 are closed, and the open/close control valve 38 inserted in the exhaust pipe 36 is opened. At the same time, the vacuum pump 40 is driven to evacuate the processing chamber 26 through the gas/liquid discharge pipe 34 and the exhaust pipe 36. Thus, the wafer W held in the processing chamber 26 is quickly dried under reduced pressure.

Figure 3:
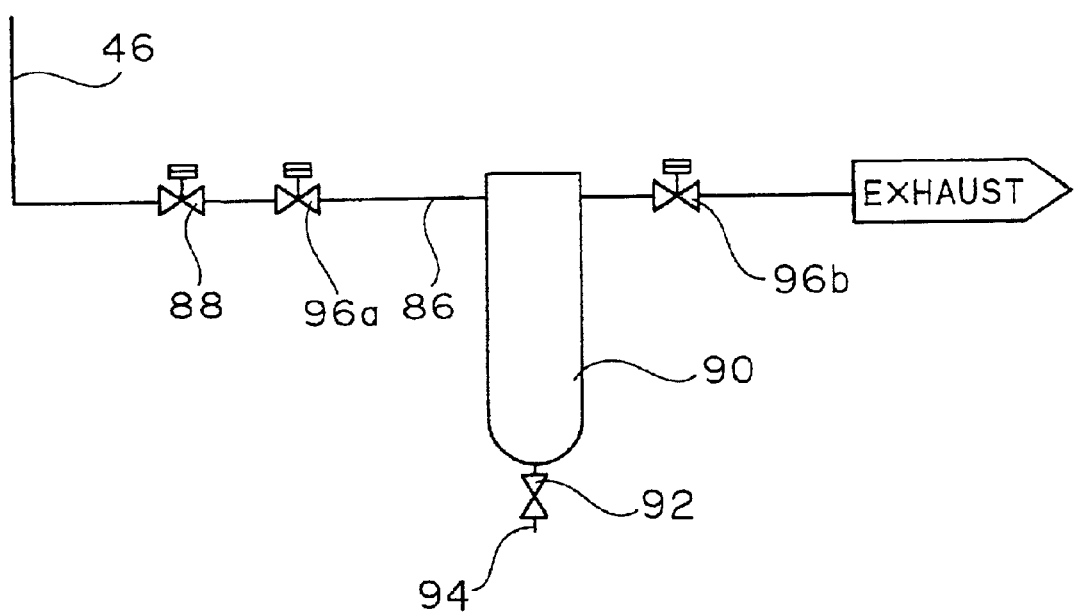
FIG. 3 is a schematic view of a means different from that shown in FIG. 1 for regulating the pressure in a processing chamber while draining drainage liquid containing organic solvent.
Figure 4:
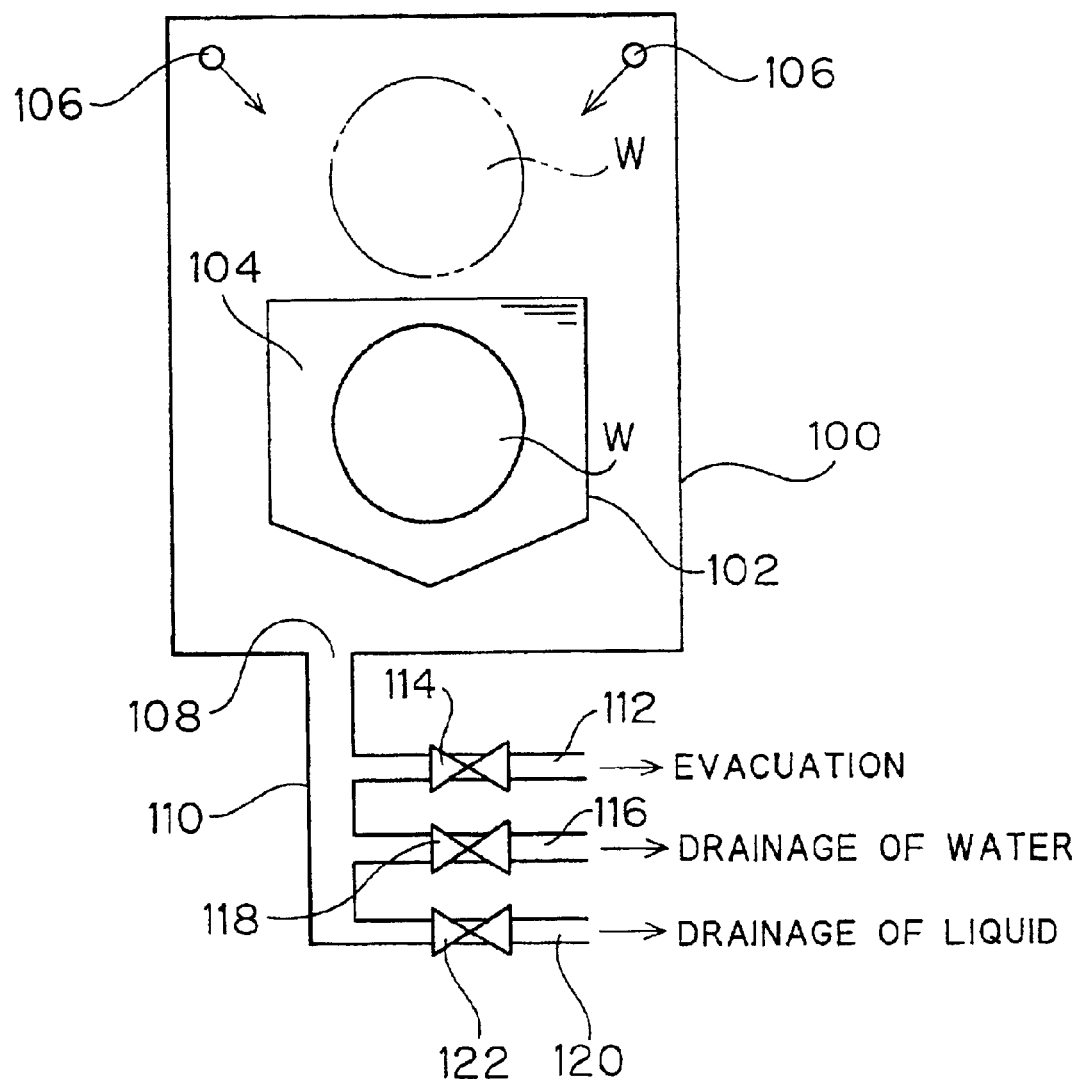
FIG. 4 is a schematic view showing an example of the general construction of a conventional substrate processing apparatus for use in performing a reduced-pressure pull up drying method.

In the above-mentioned preferred embodiment, the buffer tank 50 is inserted in the liquid drainage pipe 46, and the vapor discharge pipe 62 is connected in communication with the drainage liquid incoming compartment 58 of the buffer tank 50 and is provided with the pressure regulating valves 64a and 64b inserted therein. However, a means for regulating the pressure in the processing chamber 26 while draining the drainage liquid containing IPA is not limited to that of the preferred embodiment. For example, as illustrated in FIG. 3, the liquid drainage pipe 46 may be connected to a vapor discharge pipe 86 provided with an open/close control valve 88 and a trap 90 inserted at some midpoints therein and additionally provided with pressure regulating valves 96a and 96b inserted therein. In this case, IPA vapor exiting from the processing chamber flows out through the vapor discharge pipe 86 connected to the liquid drainage pipe 46. The pressure regulating valves 96a and 96b can regulate the pressure in the processing chamber at a fixed pressure higher than atmospheric pressure. The drainage liquid containing IPA collects in the trap 90, and is drained from the trap 90 through a drain discharge pipe 94 by opening a drain discharge valve 92 as required.

Further, in the above-mentioned preferred embodiment, the lifter 30 pulls up the wafer W after being rinsed to expose the wafer W from the pure water 82 in the processing bath 10. Alternatively, with the rinsed wafer W held stationary in the processing bath 10, the water drainage valve 20 may be opened to slowly drain the pure water 82 in the processing bath 10 from the water drainage port 16 through the water drainage pipe 18, thereby to lower the level of the pure water 82 in the processing bath 10, thus exposing the wafer W from the pure water 82.

While the invention has been described in detail, the foregoing description is in all aspects illustrative and not restrictive. It is understood that numerous other modifications and variations can be devised without departing from the scope of the invention.

What is claimed is:

1. An apparatus for performing predetermined processing on a substrate, comprising:
    a substrate exposing section for exposing a substrate from pure water stored in a processing bath disposed in a processing chamber;
    a vapor supply section for supplying a water-soluble organic solvent vapor to said substrate;
    an evacuating section for evacuating an interior of said processing chamber; and
    a pressure regulating section for regulating pressure in said processing chamber at a fixed pressure when said organic solvent vapor is supplied to said substrate, said fixed pressure being higher than atmospheric pressure and remaining within a limit for maintenance of supply of said organic solvent vapor.

2. The apparatus according to claim 1, further comprising a liquid drainage pipe for draining a drainage liquid containing an organic solvent flowing out of said processing chamber,
    wherein said pressure regulating section comprising:
        a buffer tank inserted at some midpoint in said liquid drainage pipe and having an enclosed structure, said buffer tank including an inlet and an outlet, said inlet being disposed above said outlet, said buffer tank having an interior vertically divided into a drainage liquid incoming compartment and a drainage liquid outgoing compartment, said drainage liquid incoming compartment and said drainage liquid outgoing compartment being in communication with each other at a position lower than said outlet;
        a vapor discharge pipe connected in communication with said drainage liquid incoming compartment of said buffer tank; and
        a pressure regulating valve inserted in said vapor discharge pipe.

3. The apparatus according to claim 2, wherein said organic solvent is isopropyl alcohol.

4. The apparatus according to claim 1, further comprising a liquid drainage pipe for draining a drainage liquid containing an organic solvent flowing out of said processing chamber,
    wherein said pressure regulating section comprising:
        a vapor discharge pipe connected to said liquid drainage pipe;
        a trap inserted at some midpoint in said vapor discharge pipe; and
        a pressure regulating valve inserted in said vapor discharge pipe.

5. The apparatus according to claim 4, wherein said organic solvent is isopropyl alcohol.

6. A method of performing predetermined processing on a substrate, comprising the steps of:
    immersing a substrate in pure water stored in a processing bath within a processing chamber to rinse said substrate with said pure water;
    exposing said substrate rinsed with said pure water from said pure water;
    supplying a water-soluble organic solvent vapor to said substrate when exposing said substrate from said pure water;
    placing an interior of said processing chamber under reduced pressure to dry said substrate after the supply of said organic solvent vapor; and
    regulating pressure in said processing chamber at a fixed pressure when said organic solvent vapor is supplied to said substrate, said fixed pressure being higher than atmospheric pressure and remaining within a limit for maintenance of supply of said organic solvent vapor.

7. The method according to claim 6, wherein said organic solvent is isopropyl alcohol.

8. An apparatus for performing predetermined processing on a substrate, comprising:
    substrate exposing means for exposing a substrate from pure water stored in a processing bath disposed in a processing chamber;
    vapor supply means for supplying a water-soluble organic solvent vapor to said substrate;
    evacuating means for evacuating an interior of said processing chamber; and pressure regulating means for regulating pressure in said processing chamber at a fixed pressure when said organic solvent vapor is supplied to said substrate, said fixed pressure being higher than atmospheric pressure and remaining within a limit for maintenance of supply of said organic solvent vapor.

9. The apparatus according to claim 8, further comprising a liquid drainage pipe for draining a drainage liquid containing an organic solvent flowing out of said processing chamber, wherein said pressure regulating means comprising:

a buffer tank inserted at some midpoint in said liquid drainage pipe and having an enclosed structure, said buffer tank including an inlet and an outlet, said inlet being disposed above said outlet, said buffer tank having an interior vertically divided into a drainage liquid incoming compartment and a drainage liquid outgoing compartment, said drainage liquid incoming compartment and said drainage liquid outgoing compartment being in communication with each other at a position lower than said outlet;

a vapor discharge pipe connected in communication with said drainage liquid incoming compartment of said buffer tank; and a pressure regulating valve inserted in said vapor discharge pipe.

10. The apparatus according to claim 9, wherein said organic solvent is isopropyl alcohol.

11. The apparatus according to claim 8, further comprising a liquid drainage pipe for draining a drainage liquid containing an organic solvent flowing out of said processing chamber, wherein said pressure regulating means comprising:

a vapor discharge pipe connected to said liquid drainage pipe;

a trap inserted at some midpoint in said vapor discharge pipe; and a pressure regulating valve inserted in said vapor discharge pipe.

12. The apparatus according to claim 11, wherein said organic solvent is isopropyl alcohol.

\* \* \* \* \*